United States Patent
Neumann et al.

[11] Patent Number: 5,717,248
[45] Date of Patent: Feb. 10, 1998

[54] COOLING AND SCREENING DEVICE HAVING CONTACT PINS FOR AN INTEGRATED CIRCUIT

[75] Inventors: Gerd Neumann; Hans-Jörg John; Horst Weege, all of Paderborn, Germany

[73] Assignee: Siemens Nixdorf Informationssysteme AG, Paderborn, Germany

[21] Appl. No.: 704,649

[22] PCT Filed: Mar. 2, 1995

[86] PCT No.: PCT/DE95/00273

§ 371 Date: Sep. 12, 1996

§ 102(e) Date: Sep. 12, 1996

[87] PCT Pub. No.: WO95/25347

PCT Pub. Date: Sep. 21, 1995

[30] Foreign Application Priority Data

Mar. 14, 1994 [DE] Germany ............... 9404266 U

[51] Int. Cl.[6] .................. H01L 23/34; H01L 23/10
[52] U.S. Cl. ........... 257/718; 257/706; 257/707; 257/727; 361/719; 361/720
[58] Field of Search ............... 257/718, 727, 257/706, 707; 361/719, 720

[56] References Cited

U.S. PATENT DOCUMENTS

| | | | |
|---|---|---|---|
| 4,321,423 | 3/1982 | Johnson et al. | 361/704 |
| 4,593,342 | 6/1986 | Lindsay | 361/704 |
| 5,031,028 | 7/1991 | Galich et al. | 257/718 |
| 5,053,924 | 10/1991 | Kurgan | 361/704 |
| 5,241,453 | 8/1993 | Bright et al. | 361/704 |
| 5,384,940 | 1/1995 | Soule et al. | 257/719 |
| 5,442,234 | 8/1995 | Liang | 257/718 |
| 5,488,539 | 1/1996 | Testa et al. | 361/720 |

FOREIGN PATENT DOCUMENTS

| | | |
|---|---|---|
| 0 124 421 | 11/1984 | European Pat. Off. |
| 0 127 115 | 12/1984 | European Pat. Off. |
| 0 265 285 | 4/1988 | European Pat. Off. |
| 0 340 959 | 11/1989 | European Pat. Off. |
| 0 632 686 A1 | 1/1995 | European Pat. Off. |
| 79 13 126 | 8/1979 | Germany. |
| 32 03 609 | 8/1983 | Germany. |
| 39 08 481 | 1/1990 | Germany. |
| 42 26 816 | 2/1994 | Germany. |
| 94 00 526 | 4/1994 | Germany. |
| 2163598 | 2/1986 | United Kingdom ........... 257/718 |
| 2 193 839 | 2/1988 | United Kingdom. |

OTHER PUBLICATIONS

Patent Abstracts of Japan, vol. 018, No. 643, (E-1640), 7 Dec. 1994, JP-06-252282, 09 Sep. 1994, S. Hidetoshi, Shield Structure of Package, pp. 1-6.

Patent Abstracts of Japan, vol. 15, No. 70, (E-1035), Feb. 19, 1991, JP 2-291154 A, 30 Nov. 1990, Hojo Sakae, Ceramic Package Provided With Heat Sink, 1 sheet.

Patent Abstracts of Japan, vol. 16, No.530, (E-1287), Oct. 30, 1992, JP 4-199736, 20 Jul. 1992, T. Tsuboi, Manufacture of Pin Type Radiation Fin, 1 sheet.

Primary Examiner—Mahshid D. Saadat
Assistant Examiner—T. M. Arroyo
Attorney, Agent, or Firm—Hill, Steadman & Simpson

[57] ABSTRACT

Cooling and screening device for integrated circuits, have a metal plate (26) having integrally formed cooling projections (28) and having bores (34) extending from the upper side and bottom side of the metal plate (26). Inserted into these bores (34) are contact pins (39) whose free ends form soldering tips (38) which are intended for soldering into plated-through bores (40) of a printed circuit board (20).

9 Claims, 2 Drawing Sheets

COOLING AND SCREENING DEVICE HAVING CONTACT PINS FOR AN INTEGRATED CIRCUIT

BACKGROUND OF THE INVENTION

The invention relates to a cooling and screening device for integrated circuits, in particular for VLSI chips. A prior art device is known from EP-A-0 340 959.

Chips of this type contain large-scale integrated complex circuits such as, for example, complete processors. The electric power consumption of these circuits is so high that they cannot be operated without additional cooling measures. A further problem is to be seen in that said circuits are operated at very high clock frequencies, with the result that they emanate energetic electromagnetic interfering radiation which must be screened.

It is already known to fasten to the surface of the circuit housing a heat sink whose upper side is provided with cooling ribs or cooling pins. This heat sink must be connected to frame potential in order to achieve a screening effect. FIG. 5 shows an exploded perspective representation of a cooling and screening device, known from the prior art, for an integrated circuit 2 arranged on a printed circuit board 1. Contained therein is a heat sink 3 which has a metal plate 4 on whose upper side cuboid cooling projections 5 are arranged at a regular mutual spacing. The heat sink 3 is placed with its flat bottom side 6 onto the integrated circuit and covered by a frame 8 with the interposition of electrically nonconductive spacers. Cut-outs 9 in the frame 8 permit the cooling projections 5 to penetrate the latter.

The integrated circuit 2 is surrounded by a sheet-metal spring strip 10 which is provided on its bottom edge with soldering tips 11 arranged at a regular spacing. These tips are inserted into plated-through bores 12 in the printed circuit board 1 and soldered therein. Stamped out on the upper edge of the sheet-metal spring strip 10 are S-shaped contact springs 13 which in the assembled state of the arrangement embrace the edges 14 of the cover frame 8 and produce an electrical connection between said cover frame 8 and the printed circuit board. This arrangement on the printed circuit board is generally connected to frame potential. A similar arrangement, having a closed cover plate which serves exclusively for screening purposes, is also known from European reference EP-A-0 256 285. In both cases, the cover is held only by spring force. There is no gastight connection between this cover and the contact springs.

The cooling effect of the known arrangement represented in FIG. 5 is sufficient as long as the cover frame is not detached from the springs by vibrations. In addition screening problems also arise at times. These problems occur because although the frame 8 is reliably at frame potential, the cooling projections 5 project from the cover frame and emit interfering radiation because of their antenna effect (depending on the length of the cooling projections 5).

The known heat sink 3 is produced from a press-drawn section having ribs constructed in the longitudinal direction on the upper side. Transverse grooves are milled into the ribs in order to achieve cuboid cooling projections. This necessitates an additional work operation when producing the heat sink.

SUMMARY OF THE INVENTION

It is the object of the invention to specify a cooling and screening device for integrated circuits which exhibits an improved cooling and screening behavior and has fewer parts.

This object is achieved by means of the features cited in claim 1. The heat sink is penetrated near its side edges by cut-outs which extend from its bottom side to its top side. Contact pins are inserted into these with one of their ends such that they form a reliable, permanent electrical contact with the heat sink. In this arrangement, they project perpendicularly from the bottom side of the heat sink and can therefore be inserted like a multi-contact electric component into plated-through bores the printed circuit board and be soldered in these bores. This produces not only a reliable electrical connection, but also a mechanical connection, with the result that the heat sink cannot become detached from the integrated circuit even in the case of mechanical vibrations.

The cooling effect of the heat sink can be further improved by producing the heat sink from an aluminum block using impact-extrusion technology. The heat sink then immediately has its final form, with the result that there is no need for reworking. A further advantage is to be seen in that the material density at the transition from the planar part to the cooling projections is particularly high and the direction of material flow extends in the direction of the cooling projections. The result of this is to promote the flow of heat into the cooling projections. Many geometrical shapes of cooling projections, but in particular round shapes, can be produced using this method of production. A cooling air flow can more easily flow around said shapes than angular cooling projections.

The ends of the contact pins which are intended for insertion into the cut-outs in the heat sink are widened in the shape of eyes and have sharp edges in the region of the eyes. When the contact pins are pressed into the cut-outs in the heat sink, the edges are impressed into the softer material of the heat sink and thus form a gastight electrical connection between the heat sink and the contact pins.

This leads to a firm and permanently corrosion-free connection particularly when the contact pins consist of a spring-tempered tin bronze.

In a development of the invention, the contact pins are connected to one another in their middle region by a sheet-metal strip on which they are integrally formed. It is therefore possible in a simple way for a plurality of contact pins to be produced by stamping out in one work operation together with the sheet-metal strip connecting them.

In an exemplary embodiment of the device according to the invention, shown in FIG. 4, the end of the contact pins which is near the heat sink is elastically deformable and is bent back in the shape of an S so far in the direction of the heat sink that the S bend remote from the eye touches the heat sink. If this resilient region is held under tensile stress while the contact pins are being soldered into the plated-through bores of the electric printed circuit board, the restoring force of the resilient regions of all the contact pins presses the heat sink firmly onto the integrated circuit, as a result of which the transfer of heat from the latter to the heat sink is yet further improved. The biasing of the resilient region can be set in a particularly simple and uniform fashion for all the contact pins owing to the fact that before the soldering-in a spacer is inserted between the heat sink and the S bends touching it. This spacer is removed again after the contact pins have been soldered in. The restoring force of the resilient regions of all the contact pins then presses the heat sink onto the integrated circuit in a particularly uniform fashion, with the result that tilting and thus poorer heat transfer are excluded.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
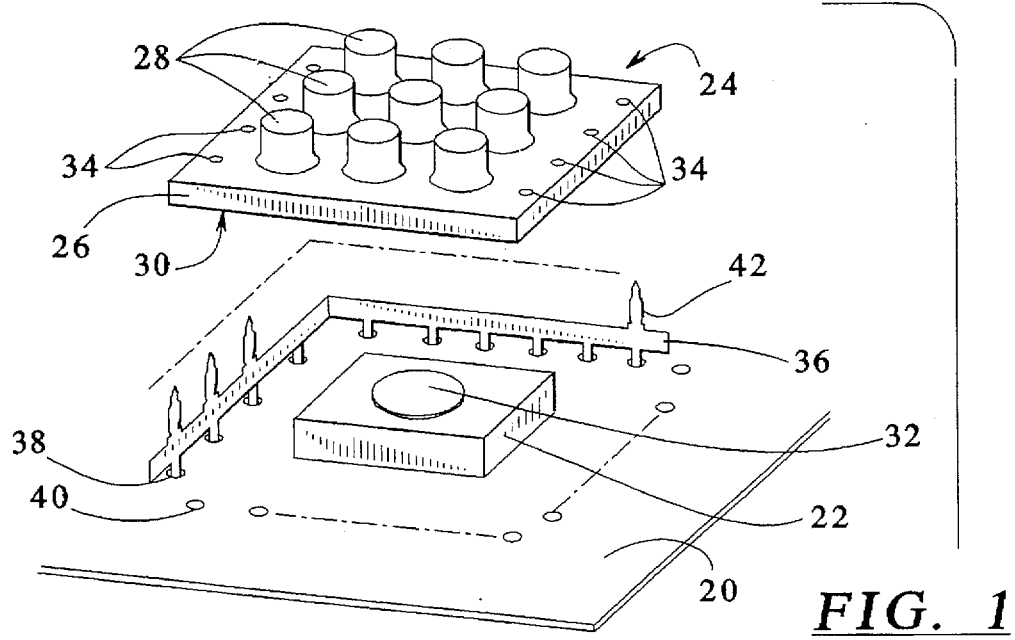
FIG. 1 shows a perspective plan view of a printed circuit board which is fitted with an integrated circuit and has a cooling and screening device, in an exploded representation.
Figure 5:
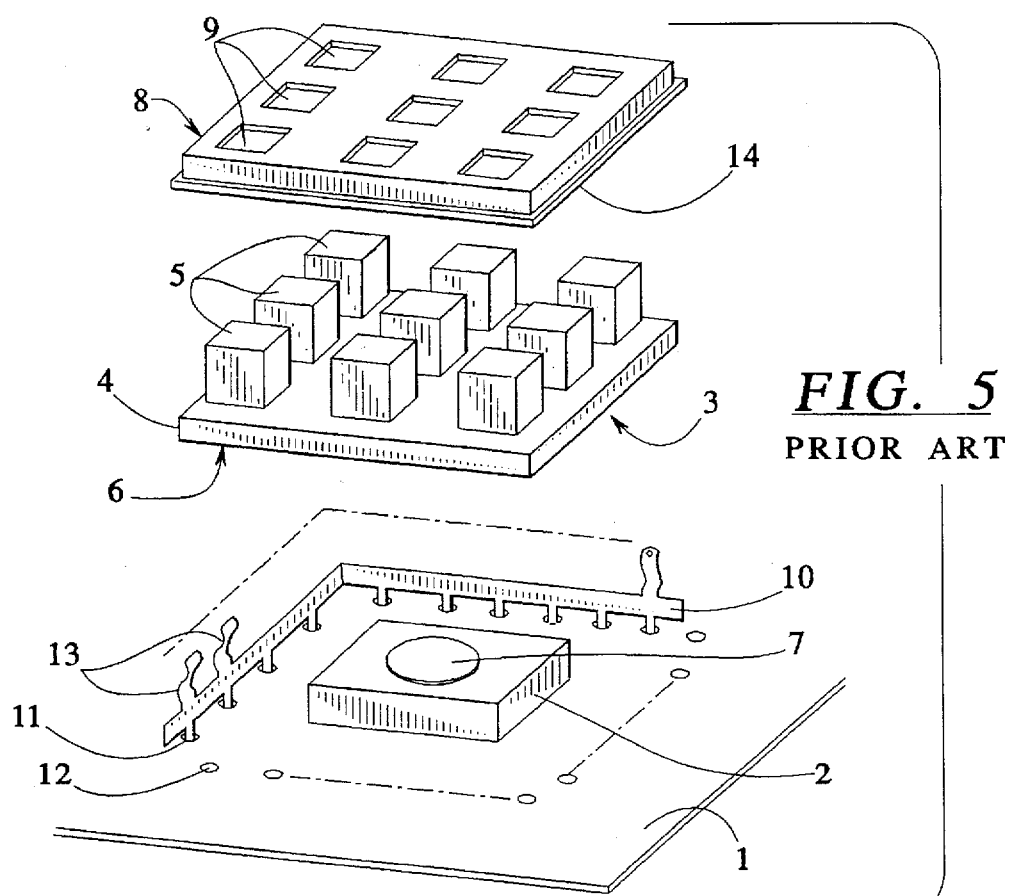
FIG. 5 shows a cooling and screening device according to the prior art.

FIG. 1 represents a printed circuit board 20 having a VLSI chip 22. It is possible to place on the latter a heat sink 24 which has a plate 26 on whose upper side cylindrical cooling projections 28 are integrally formed. The bottom side 30 of the heat sink 24 is flat, at least in the region where it touches the chip (FIG. 2c). The heat sink 24 can be placed onto the chip 22 with its bottom side 30, with the interposition of an electrically insulating heat-conducting foil 32. Parallel to its edges and at a small spacing therefrom, the plate 26 of the heat sink 24 is penetrated by cut-outs 34 which penetrate the plate in the vertical direction (FIG. 2b).

Sheet-metal strips 36 made from tin bronze are arranged at a spacing from the chip 22 parallel to the lateral edges of the latter (represented only partly in FIG. 1). This can be a single sheet-metal strip bent over respectively at the corners as in FIG. 1, or four individual sheet-metal strips as in FIG. 2b. Integrally formed on one edge of the sheet-metal strip 36 at regular spacings are soldering tips 38 which are intended for insertion into plated-through bores 40 on the printed circuit board 20, and subsequent soldering to said bores 40. The plated-through bores are connected to one another and to frame potential by printed conductors (not represented).

Integrally formed on the other edge of the sheet-metal strips at the spacing of the cut-outs 34 are press-fit pins 42 which terminate at their free end in a tip 44. The latter facilitates threading the press-fit pins 42 into the cut-outs 34. A soldering tip 38 respectively forms a contact pin 39 with the press-fit pin 42 adjacent to it.

Figure 3:
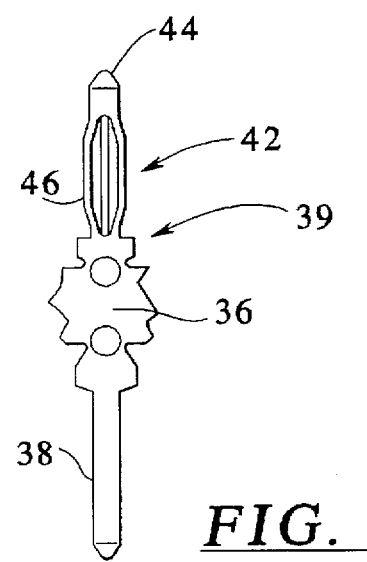
FIG. 3 shows a first exemplary embodiment of a contact pin.

As is to be seen, in particular, in FIG. 3, the press-fit pins 42 are widened in their middle region in a fashion resembling an eye 46. When the press-fit pins 42 are pressed into the cut-outs 34, the edges of the eyes 46 are impressed in the softer material of the heat sink 24 and form with the latter an intimate electrical and mechanical contact.

Figure 2A:
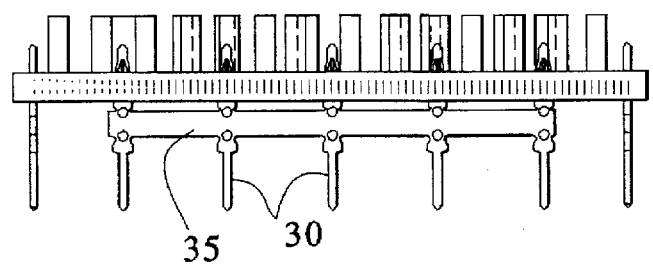
FIG. 2 shows the cooling and screening device of FIG. 1 in three views.
Figure 2C:
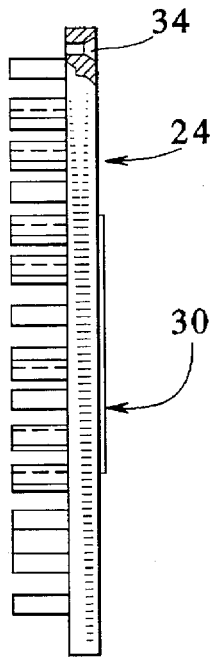
Figure 2B:
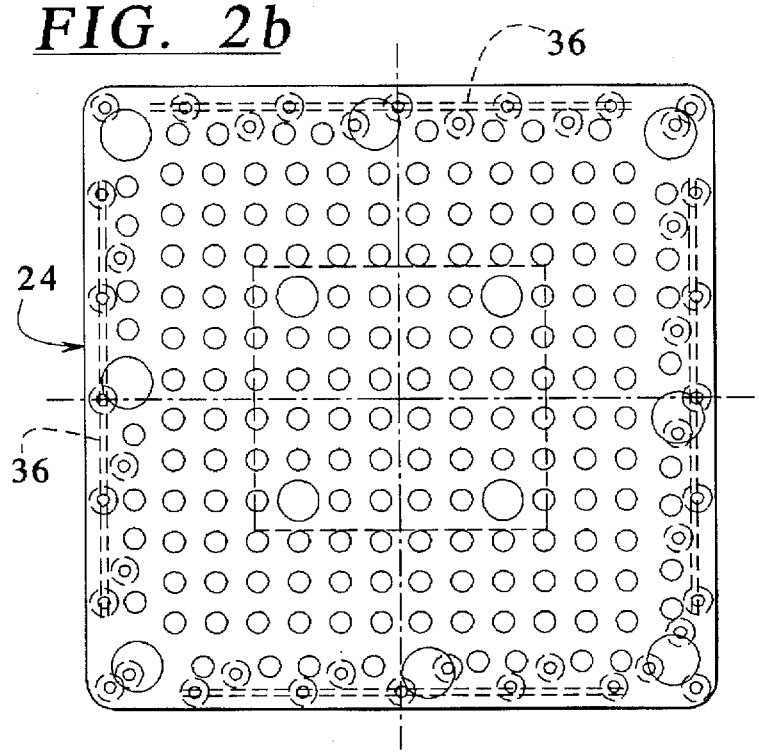

FIG. 2a shows the heat sink 24 with the contact pins pressed in. In this case, the sheet-metal strips 36 come to lie parallel to the bottom side 30 of the heat sink 24. If the arrangement composed of heat sink 24 and sheet-metal strip 36 is now, as shown in FIG. 1, inserted with the soldering tips 38 into the plated-through bores 40 of the printed circuit board 20, the chip is enclosed on five sides by metal parts at frame potential. The chip is screened in a known way on the bottom side by a layer at frame potential of the printed circuit board 20, which is generally constructed as a multilayer.

Figure 4:
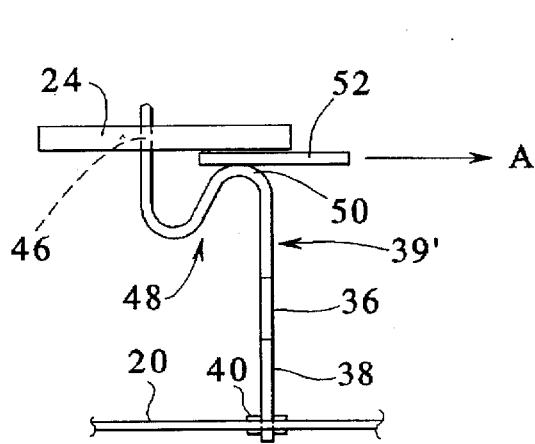
FIG. 4 shows a second exemplary embodiment of a contact pin.

FIG. 4 shows a second exemplary embodiment of the contact pin 39' in side view. In its design, the latter corresponds essentially to the exemplary embodiment represented in FIG. 3. However, between the sheet-metal strip 36 and the eye 46 an elastically deformable S-shaped spring part 48 is inserted in such a way that the S bend 50 remote from the eye 46 touches the bottom side of the heat sink 24.

The assembly of the cooling and screening device with the chip 22 and the printed circuit board 20 is performed in such a way that a spacer 52 is inserted in the plated-through bores 40 between the heat sink 24 and the S bend 50 before the soldering of the soldering tips 38. The soldering tips 38 are now inserted into the plated-through bores 40 in such a way that the bottom side 30 of the heat sink 24 comes to lie over all its surface on the chip 22. Thereupon, the soldering tips 38 are soldered to the plated-through bores 40. Subsequently, the spacer 52 is withdrawn in the direction of the arrow A from the gap between the S bend 50 and the heat sink 24. The restoring forces of the S-shaped spring parts 48 of all the contact pins 39' then press the heat sink 24 onto the chip surface, as a result of which an intimate thermal coupling is ensured between the two.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A cooling and screening device for an integrated circuit, comprising:

a planar heat sink made from metal and having a flat bottom side that contacts the integrated circuit and an upper side which is fitted with cooling projections and covered along and near side edges of the upper side by cut-outs extending from the bottom side to the upper side;

contact pins having first and second ends being inserted into the cut-outs of the heat sink to form an electrical connection, the contact pins projecting perpendicularly from the bottom side of said heat sink each first end of the contact pins being constructed as a press-fit pin which is widened in the shape of an eye and, at least in a region of the eye-shaped widening, has sharp edges;

in a region of the edges a gastight electrical connection being between the heat sink and the press-fit pins inserted into the cut-outs said second ends of the contact pins being constructed as soldering tips for insertion into plated-through bores of an electric printed circuit board carrying the integrated circuit.

2. The device as claimed in claim 1, wherein the cooling projections are columns which project perpendicularly from the upper side and have a cross section, whose extent is approximately the same in the two dimensions of a plane of the upper side of the heat sink.

3. The device as claimed in claim 1, wherein the heat sink is formed in one piece from impact-extruded aluminum.

4. The device as claimed in claim 1, wherein the contact pins consist of spring-tempered tin bronze.

5. The device as claimed in claim 1, wherein a plurality of contact pins are connected to one another in their middle region by a sheet-metal strip, the contact pins and the sheet-metal strip being one piece.

6. The device as claimed in claim 5, wherein the first ends of the contact pins, which are near the heat sink, are elastically deformable in the shape of an S and are bent back so far in a direction of the heat sink that the S bend remote from the eye-shaped widening touches the heat sink.

7. The device as claimed in claim 6, wherein a spacer is located between the heat sink and the S bends, the spacer being removable after insertion of soldering tips of the contact pins into the plated-through bores of the printed circuit board.

8. The device as claimed in claim 1, wherein the integrated circuit is a VLSI chip.

9. The device as claimed in claim 2, wherein the cooling projections have a round cross section.

* * * * *